United States Patent
Fusella et al.

(10) Patent No.: US 12,082,439 B2
(45) Date of Patent: Sep. 3, 2024

(54) PURCELL ENHANCEMENT VIA TAMM PLASMON STACK IN OLED STRUCTURES

(71) Applicant: Universal Display Corporation, Ewing, NJ (US)

(72) Inventors: Michael Fusella, Lawrenceville, NJ (US); Nicholas J. Thompson, New Hope, PA (US); Vinod M. Menon, New York, NY (US)

(73) Assignee: Universal Display Corporation, Ewing, NJ (US)

( * ) Notice: Subject to any disclaimer, the term of this patent is extended or adjusted under 35 U.S.C. 154(b) by 30 days.

(21) Appl. No.: 16/814,316

(22) Filed: Mar. 10, 2020

(65) Prior Publication Data
US 2020/0295307 A1 Sep. 17, 2020

Related U.S. Application Data

(60) Provisional application No. 62/817,409, filed on Mar. 12, 2019.

(51) Int. Cl.
*H10K 50/856* (2023.01)
*G02B 5/18* (2006.01)

(52) U.S. Cl.
CPC ......... *H10K 50/856* (2023.02); *G02B 5/1861* (2013.01)

(58) Field of Classification Search
CPC ... G02B 5/1861; G02B 5/008; H01L 51/5262; H01L 51/5218; H01L 51/5221; H01L 51/5024; H01L 51/5203; H01L 51/5271; H01L 2251/558
See application file for complete search history.

(56) References Cited

U.S. PATENT DOCUMENTS

| | | | |
|---|---|---|---|
| 4,769,292 A | 9/1988 | Tang |
| 5,247,190 A | 9/1993 | Friend |
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |
| 6,294,398 B1 | 9/2001 | Kim |

(Continued)

FOREIGN PATENT DOCUMENTS

| | | |
|---|---|---|
| CN | 112242493 | 1/2021 |
| EP | 3772758 | 2/2021 |

(Continued)

OTHER PUBLICATIONS

Baldo et al. Highly efficient phosphorescent emission from organic electroluminescent devices, Nature, vol. 395, pp. 151-154, 1998.

(Continued)

*Primary Examiner* — Kyoung Lee
*Assistant Examiner* — Christina A Sylvia
(74) *Attorney, Agent, or Firm* — Butzel Long

(57) ABSTRACT

Device structures are provided that include an OLED arranged in a stack with one or more additional layers that form a Tamm plasmon stack. The structure allows for coupling emitter excited state energy into the emissive Tamm plasmon mode.

21 Claims, 9 Drawing Sheets

(56) References Cited

U.S. PATENT DOCUMENTS

| | | | |
|---|---|---|---|
| 6,303,238 | B1 | 10/2001 | Thompson |
| 6,337,102 | B1 | 1/2002 | Forrest |
| 6,406,801 | B1 | 6/2002 | Tokito |
| 6,468,819 | B1 | 10/2002 | Kim |
| 7,071,615 | B2 | 7/2006 | Lu |
| 7,279,704 | B2 | 10/2007 | Walters |
| 7,431,968 | B1 | 10/2008 | Shtein |
| 7,968,146 | B2 | 6/2011 | Wagner |
| 9,252,378 | B2 | 2/2016 | Dobbertin |
| 2003/0136959 | A1 | 7/2003 | Araki |
| 2003/0230980 | A1 | 12/2003 | Forrest |
| 2004/0174116 | A1 | 9/2004 | Lu |
| 2005/0260449 | A1 | 11/2005 | Walters |
| 2006/0133437 | A1* | 6/2006 | Forrest ............... H01S 5/36 372/39 |
| 2007/0063641 | A1 | 3/2007 | Cok |
| 2008/0233287 | A1 | 9/2008 | Shtein |
| 2008/0237181 | A1 | 10/2008 | Wagner |
| 2009/0135874 | A1* | 5/2009 | Liu ............... H01S 5/18397 372/45.01 |
| 2011/0180757 | A1 | 7/2011 | Vockic |
| 2013/0026452 | A1 | 1/2013 | Kottas |
| 2013/0107344 | A1 | 5/2013 | Avouris |
| 2013/0119354 | A1 | 5/2013 | Ma |
| 2014/0252331 | A1 | 9/2014 | Oh |
| 2015/0008419 | A1* | 1/2015 | Li ............... H01L 51/5024 257/40 |
| 2017/0229663 | A1 | 8/2017 | Tsai |
| 2019/0081248 | A1 | 3/2019 | Lin |
| 2019/0131531 | A1* | 5/2019 | Luschtinetz ......... C07F 9/5325 |
| 2019/0157572 | A1* | 5/2019 | Koch ............... C09K 19/3861 |
| 2020/0295307 | A1 | 9/2020 | Fusella |
| 2021/0020867 | A1 | 1/2021 | Forrest |
| 2021/0336161 | A1* | 10/2021 | Xiang ............... B32B 27/065 |

FOREIGN PATENT DOCUMENTS

| | | |
|---|---|---|
| JP | 2010135467 A | 6/2010 |
| KR | 20180047611 A | 5/2018 |
| KR | 20200110223 | 9/2020 |
| KR | 20210010837 | 1/2021 |
| WO | 2004111066 A1 | 12/2004 |
| WO | 2008044723 A1 | 4/2008 |
| WO | 2008057394 A1 | 5/2008 |
| WO | 2010011390 A2 | 1/2010 |
| WO | 2010111175 A1 | 9/2010 |
| WO | 2013130483 | 9/2013 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

Baldo et al, "Transient Analysis of Organic Electrophosphorescence. II. Transient Analysis of Triplet-Triplet Annihilation", Physical Review B, V. 62, No. 16, 2000, pp. 10967-10977.

Celebi, K., Heidel, T. D. & Baldo, M.A. Simplified calculation of dipole energy transport in a multilayer stack using dyadic Green's functions. Opt. Express 15, 1762 (2007).

D. Ha, et al., "Dominance of Exciton Lifetime in the Stability of Phosphorescent Dyes" Advanced Optical Materials 7.21 (2019).

Extended European Search Report for App. No. EP20186321 .4, dated Mar. 19, 2021, 12 pages.

Giebink et al., "Intrinsic Luminance loss in Phosphorescent Small-Molecule Organic Light Emitting Devices Due to Bimolecular Annihilation Reactions", Journal of Applied Physics, vol. 103, Issue 4, pp. 044509-044509-9 (2008).

Hamze, et al., "Quick-Silver" from a Systematic Study of Highly Luminescent, TwoCoordinate, d10 Coinage Metal Complexes J. Am. Chem. Soc. 2019, 141, 8616-8626.

Hamze, et al., Science 2019, 363, 601-606.

Jeong, C. et al. Understanding molecular fragmentation in blue phosphorescent organic light-emitting devices. Org. Electron. 64, 15-21 (2019).

Kim, J., et al., Systematic Control of the Orientation of Organic Phosphorescent Pt Complexes in Thin Films for Increased Optical Outcoupling. Advanced Materials 2019, 1900921.

Kim, S.-Y., et al., Organic Light-Emitting Diodes with 30% External Quantum Efficiency Based on a Horizontally Oriented Emitter. Advanced Functional Materials 2013, 23 (31 ), 3896-3900.

Lee, J. et al. Hot excited state management for long-lived blue phosphorescent organic light-emitting diodes. Nat. Commun. 8, 1-9 (2017).

Liu, Y., et al., All-organic thermally activated delayed fluorescence materials for organic light-emitting diodes. Nature Reviews Materials 2018, 3 (4).

R. Czerwieniec, "Cu(I) complexes—Thermally activated delayed fluorescence. Photophysical approach and material design," Coordination Chemistry Reviews, vol. 325, pp. 2-28, 2016.

Schinabeck, A.; Chen, J.; Kang, L.; Teng, T.; Homeier, H. H. H.; Suleymanova, A. F.; Shafikov, M. Z.; Yu, R.; Lu, C.-Z.; Yersin, H., Symmetry-Based Design Strategy for Unprecedentedly Fast Decaying Thermally Activated Delayed Fluorescence (TADF). Application to Dinuclear Cu(I) Compounds. Chemistry of Materials 2019, DOI: 10.1 021 /acs.chemmater.9b00671, 13 pages.

Shi, S., et al., Highly Efficient Photo- and Electroluminescence from Two-Coordinate Cu(I) Complexes Featuring Nonconventional N-Heterocyclic Carbenes. J. Am. Chem. Soc. 2019, 141 (8), 3576-3588.

Sim, B., Moon, C. K., Kim, K. H. & Kim, J. J. Quantitative Analysis of the Efficiency of OLEDs. ACS Appl. Mater. Interfaces 8, 33010-33018 (2016).

Uoyama, H., et al., Highly efficient organic light-emitting diodes from delayed fluorescence. Nature 2012, 492 (7428), 234-8.

Zhang, Y., Lee, J. & Forrest, S. R. Tenfold increase in the lifetime of blue phosphorescent organic light-emitting diodes. Nat. Commun. 5, 5008 (2014), 7 pages.

Korean Office Action (including English translation) issued in App. No. KR1020200030832, dated Dec. 1, 2023, 8 pages.

Xu-Lin Zhang et al. Hybrid Tamm plasmon-polariton/microcavity modes for white top-emitting organic light-emitting devices. Optica, vol. 2, No. 6, Jun. 2015.

* cited by examiner

PURCELL ENHANCEMENT VIA TAMM PLASMON STACK IN OLED STRUCTURES

CROSS-REFERENCE TO RELATED APPLICATIONS

This application is a non-provisional, and claims the priority benefit, of U.S. patent application Ser. No. 62/817,409, filed Mar. 12, 2019, the entire contents of which are incorporated herein by reference.

FIELD

The present invention relates to structures and arrangements for use in devices such as organic light emitting diodes, and devices including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
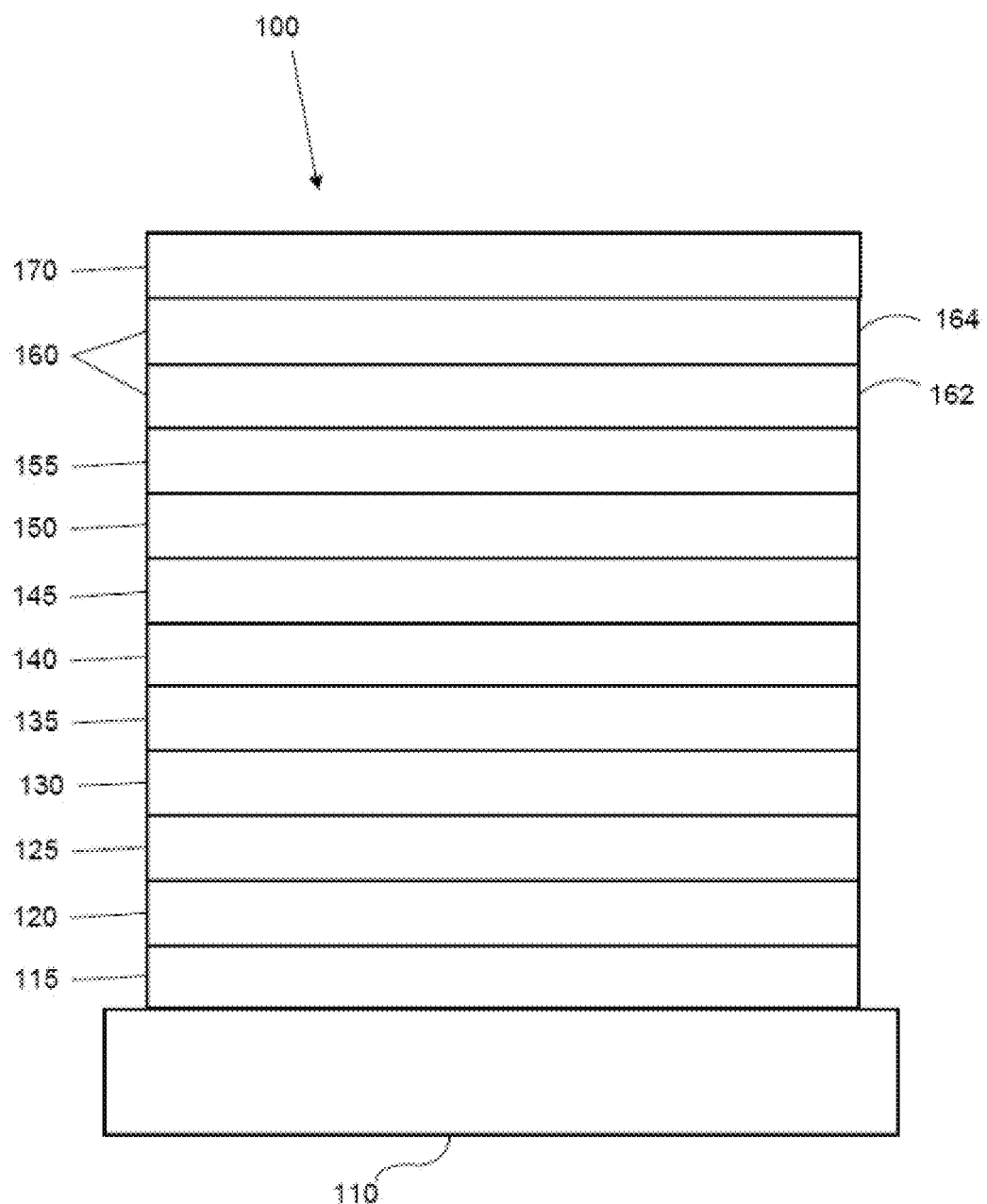
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
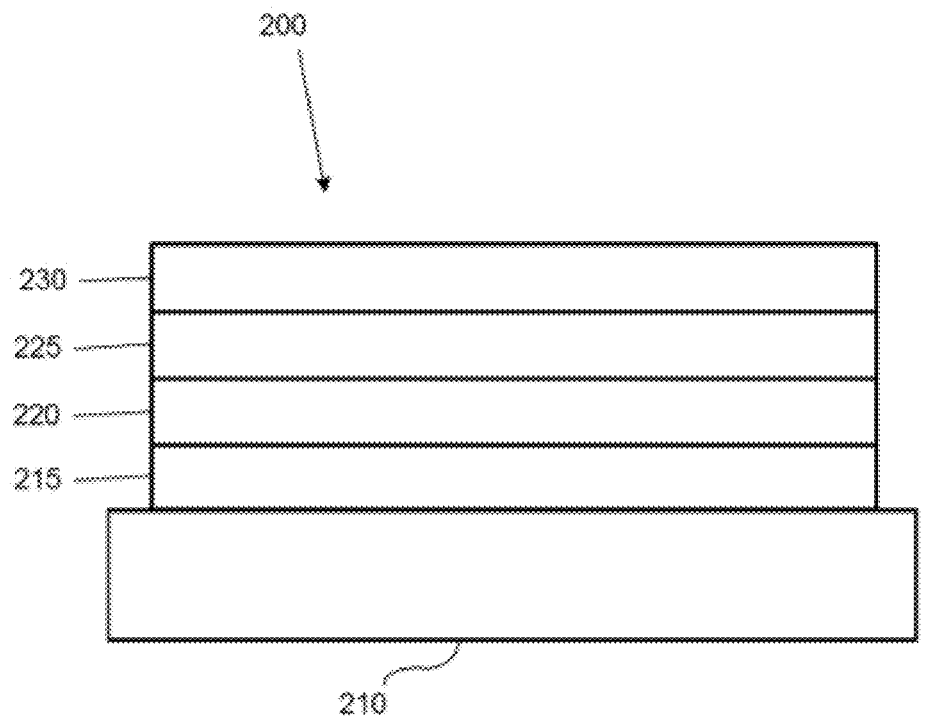
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light, which may be altered by another layer such as a color filter or other color altering layer that does not itself emit an initial light within the device, but may re-emit altered light of a different spectra content based upon initial light emitted by the emissive layer.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, microdisplays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination With Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

When an emitter, such as the organic emissive materials and layers disclosed herein, is placed in an environment with an increased density of photonic states relative to vacuum, the emission rate of the emitter increases. This is known as the Purcell effect. This enhanced emissive and non-radiative rates decrease the length of time the emitter stays in the excited state, thereby stabilizing the emitter and reducing the aging rate of a device such as an OLED that incorporates the emitter. Some OLED architectures take advantage of this effect by using an enhancement layer having a plasmonic material that exhibits surface plasmon resonance that non-radiatively couples to an emissive material, thereby allowing for transfer of excited state energy from the emissive material to a non-radiative mode of surface plasmon polaritons. Such devices are described, for example, in U.S. Pat. No. 9,960,386, the disclosure of which is incorporated by reference in its entirety.

The present disclosure provides device architectures that allow for coupling emitter excited state energy into a Tamm plasmon mode, which is an emissive plasmon state (i.e. it lies above the light line).

Tamm plasmon-polaritons (TPPs), also known as optical Tamm states, are surface electromagnetic states that are confined to the interface or region between two reflective photonic structures. Examples of suitable reflective structures include plasmonically-active metal thin films, typically, but not limited to, Ag, Al, Au, Ir, Pt, Ni, Cu, W, Ta, Fe, Cr, Mg, Ga, Rh, Ti, Ru, Pd, In, Bi, Ca and/or stacks or alloys of these metals, from 10-1000 nm thick, a distributed Bragg reflector (DBR), which includes alternating layers of high- and low-refractive index dielectric materials with the thickness of each layer set by the condition $\lambda/4n$, where n is the refractive index of the layer and $\lambda$ is the desired wavelength of the DBR, and/or a photonic crystal layer. More generally, a layer is "reflective" as used herein if it is sufficiently reflective to form a Tamm plasmon stack with another reflective layer as described in further detail below. That is, two layers are "reflective" as used herein if, when placed in a stacked configuration with each other, Tamm plasmon-polaritons are formed. In contrast to surface plasmon polaritons (SPPs), TPPs are emissive states that can couple energy to the far field without the aid of a prism or similar structure. It has been found that incorporating a structure that creates TPPs within an OLED may provide enhanced device stability while preserving an acceptable external quantum efficiency (EQE).

Figure 3A:
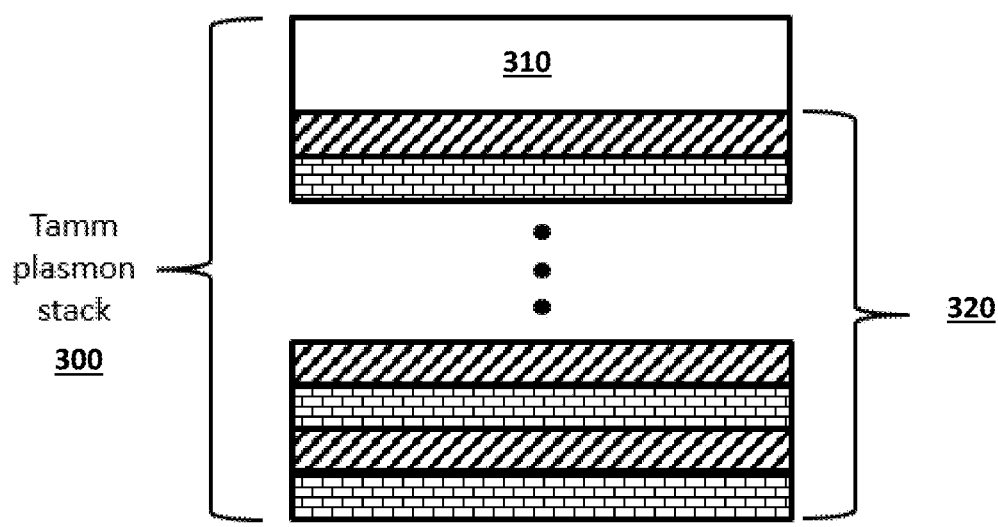
FIG. 3A shows a schematic representation of a reflective layer disposed in a stack with a plasmonically-active metal thin film to form a Tamm plasmon stack as disclosed herein.

FIG. 3A shows an example of such a structure, referred to herein as a "Tamm plasmon stack," in which this effect is observed, i.e., in which TPPs are formed. The stack includes two outer reflective layers 310, 320 as previously disclosed. Each reflective layer may be a metal thin film or stacks of metal thin films, a Bragg reflector, or an equivalent structure. In the example shown in FIG. 3A, a first reflective layer 310 is shown as a single layer, such as a metal thin film, and the second reflective layer 320 is shown as a multi-layer structure, such as a set of stacked thin metal films or a distributed Bragg reflector. However, these specific reflective layers are not required and may be inverted, or both layers may be the same structure. Similarly, a reflective metal thin film layer may include multiple sub-layers, which may be the same or different materials. The two layers 310, 320 may be described as forming a Tamm plasmon stack 300 as disclosed herein. Notably, TPPs may be created by a Tamm plasmon stack even where the stack is arranged in a stack with another structure. In some cases, other layers may be arranged between the reflective layers 310, 320 that define the Tamm plasmon stack without adversely affecting operation of the Tamm plasmon stack.

Figure 3B:
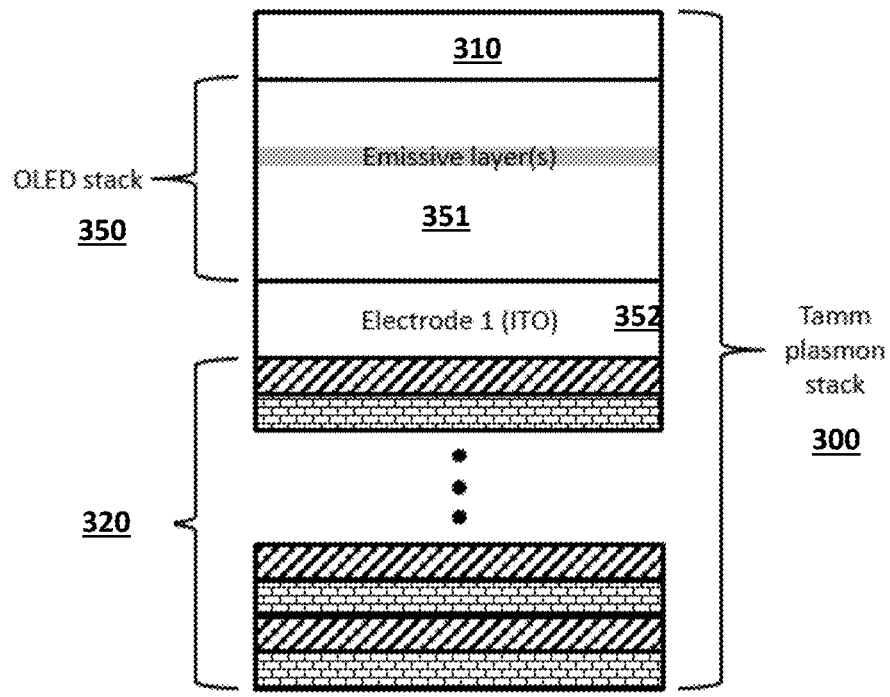
FIG. 3B shows an example of a stacked arrangement that includes an OLED and a Tamm plasmon stack as disclosed herein, in which the OLED stack is located within the Tamm plasmon stack.
Figure 3C:
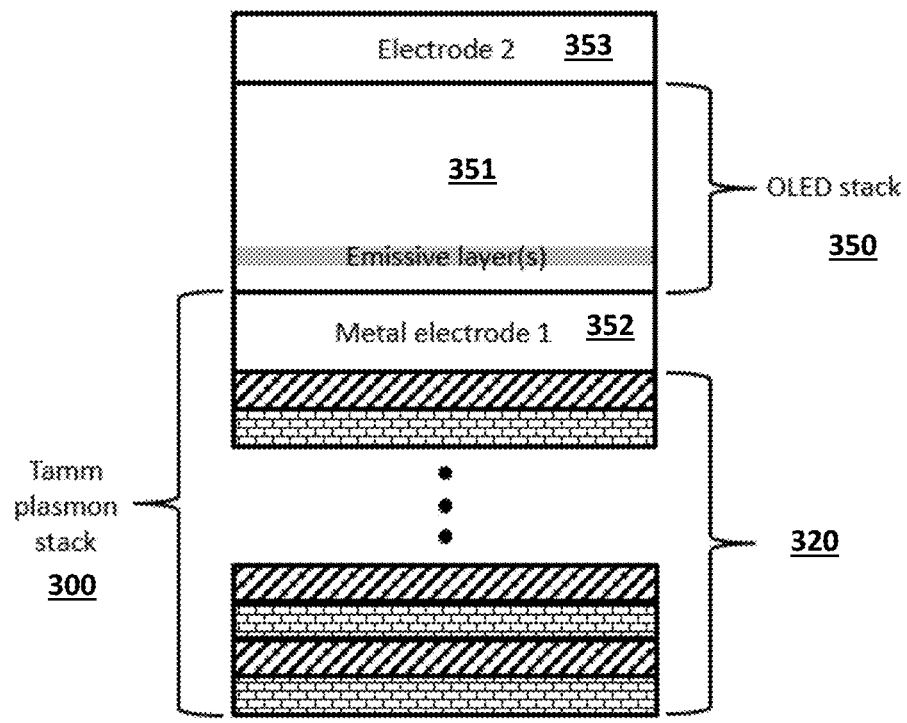
FIG. 3C shows an example of a stacked arrangement that includes an OLED and a Tamm plasmon stack as disclosed herein, in which the OLED stack is located outside of the Tamm plasmon stack.

FIGS. 3B and 3C show examples of an OLED device that includes a Tamm plasmon stack. As previously disclosed, the Tamm plasmon stack 300 may be formed by two outer reflective layers 310, 320. An OLED stack 350 is disposed in a stack with the Tamm plasmon stack 300. As used herein, the Tamm plasmon stack and the OLED stack may be described as being in a "stack" with one another and/or the devices as a whole may be described as being arranged in a "stacked configuration" since they at least partially overlap one another vertically. A particular type of stack, such as an OLED stack or a Tamm plasmon stack, may be referred to by the outermost layers that form the stack, whether or not they are also shared by other stacks or components. For example, referring to FIG. 3B, the OLED stack is formed by the reflective layer 310 (which operates as an electrode for the OLED 350) and the electrode 352, and the Tamm plasmon stack 300 is formed by the reflective layer 310 and the lower reflective layer 320. Since the same layer may operate both as a reflective layer for a Tamm plasmon stack and as an electrode for an OLED in a stacked configuration with the Tamm plasmon stack, the same materials and configurations described with respect to the Tamm plasmon stack reflective layers may be used as electrode layers in any configurations disclosed herein. For example, electrodes that form OLED stacks as disclosed herein may include one or more layers of Ag, Al, Au, Ir, Pt, Ni, Cu, W, Ta, Fe, Cr, Mg, Ga, Rh, Ti, Ru, Pd, In, Bi, Ca, or stacks or alloys thereof. Similarly, where a Tamm plasmon stack uses a DBR as a reflective layer, one or more layers of the DBR may function as an electrode for an OLED arranged in a stack with the Tamm plasmon stack.

The OLED stack may include one or more of the layers described with respect to FIGS. 1 and 2, including but not limited to emissive layers, transport layers, blocking layers, charge generation layers, and the like. The OLED stack 350 may be disposed within the Tamm plasmon stack 300, as in FIG. 3B, or outside the Tamm plasmon stack 300 as shown in FIG. 3C. It may be preferred for a thin metal film in the Tamm plasmon stack to be less than 50 nm thick, in which case the electric field may pass through the metal and reach the EML of the OLED stack 351. This thickness may be used regardless of whether the thin film also operates as an electrode for an OLED stack or not. Depending on the thickness of the metal, the OLED may emit from either side of the stack.

In the arrangement shown in FIG. 3B, the OLED stack is formed by two electrodes 310, 352, one or more of which may also function as a reflective layer for the Tamm plasmon stack, with one or more emissive layers 351 disposed between the electrodes 310, 352. In this example, the first reflective layer 310 is also an upper electrode for the OLED stack 350. Alternatively or in addition, the electrode 352 may be the second reflective layer 320, or may be provided by one layer of a multi-layer reflective layer structure 320. The electrode 352 may be ITO or any other suitable material or combination of materials.

The example structure shown in FIG. 3C has many of the same components as FIG. 3B. In this example, the OLED stack 350 is formed by two electrodes 352, 353. As with the arrangement shown in FIG. 3B, one of the electrodes 352 also provides a reflective layer for the Tamm plasmon stack 300. However, in this arrangement the lower electrode 352 provides the second layer for the Tamm plasmon stack 300 instead of the upper electrode 353. In this arrangement the second electrode 353 may be reflective and may be identical to the reflective layer 310 in FIG. 3B, or it may be different.

Figure 4A:
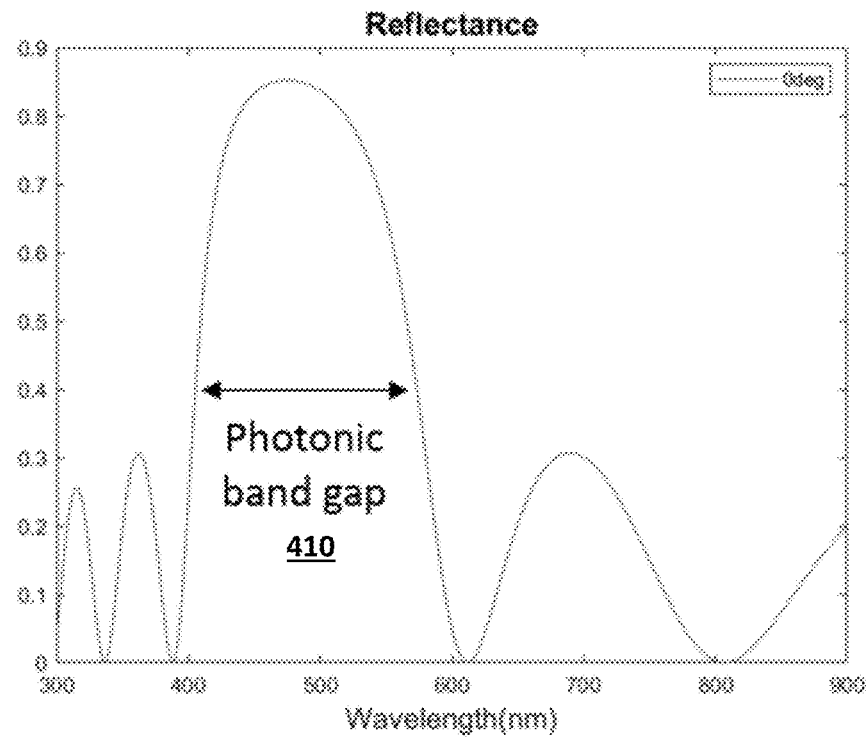
FIG. 4A shows a simulated reflectance spectrum for a DBR at normal incidence with no adjacent metal film, resulting in a photonic band gap as disclosed herein.
Figure 4B:
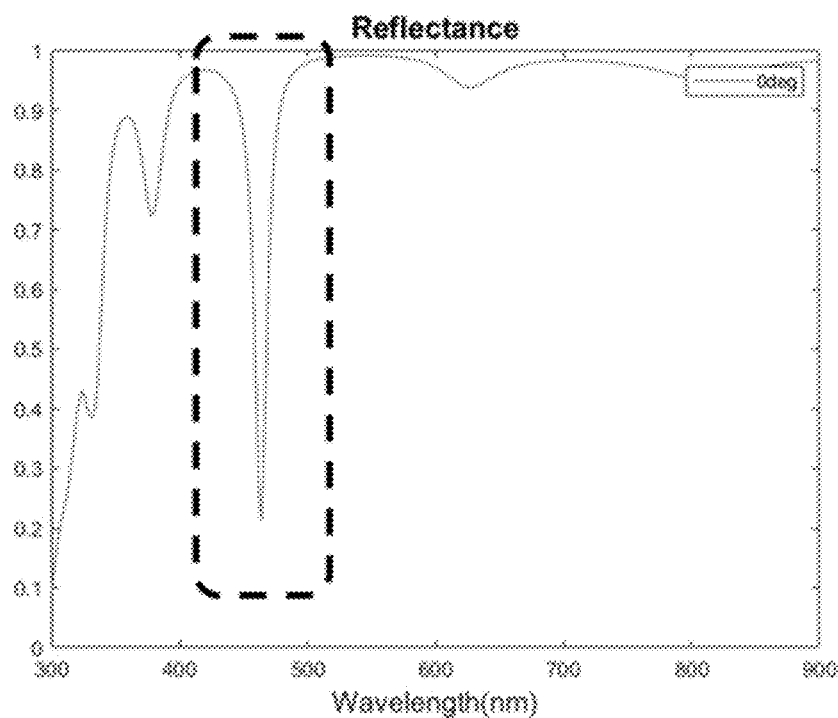
FIG. 4B shows a reflectance minimum at normal incidence for an example device as shown in FIG. 3B, which occurs within the photonic band gap as disclosed herein.

As previously noted, one or more of the reflective layers that forms a Tamm plasmon stack as disclosed herein may be a distributed Bragg reflector (DBR). In such a configuration, the DBR component may create a photonic band gap, i.e. a wavelength range over which little or no light is transmitted through the DBR stack. FIG. 4A shows a simulated reflectance spectrum for a DBR at normal incidence with no adjacent metal film, which results in the photonic band gap 410. FIG. 4B shows the reflectance minimum (highlighted by a dashed box) at normal incidence for an example device as illustrated in FIG. 3B, which occurs within the photonic band gap. Notably, the addition of the metal layer results in the characteristic sharp dip in the reflection spectrum within the photonic band gap, indicating the presence of the TPP mode.

Figure 5A:
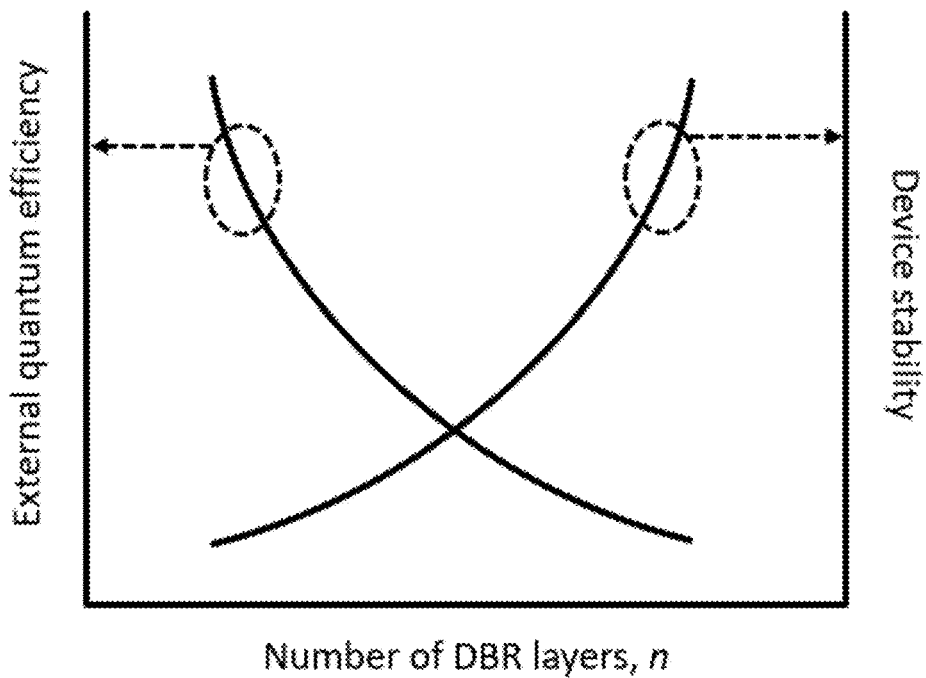
FIG. 5A schematically depicts the expected trend that (a) device stability increases with increasing number of DBR layers while external quantum efficiency decreases.
Figure 5B:
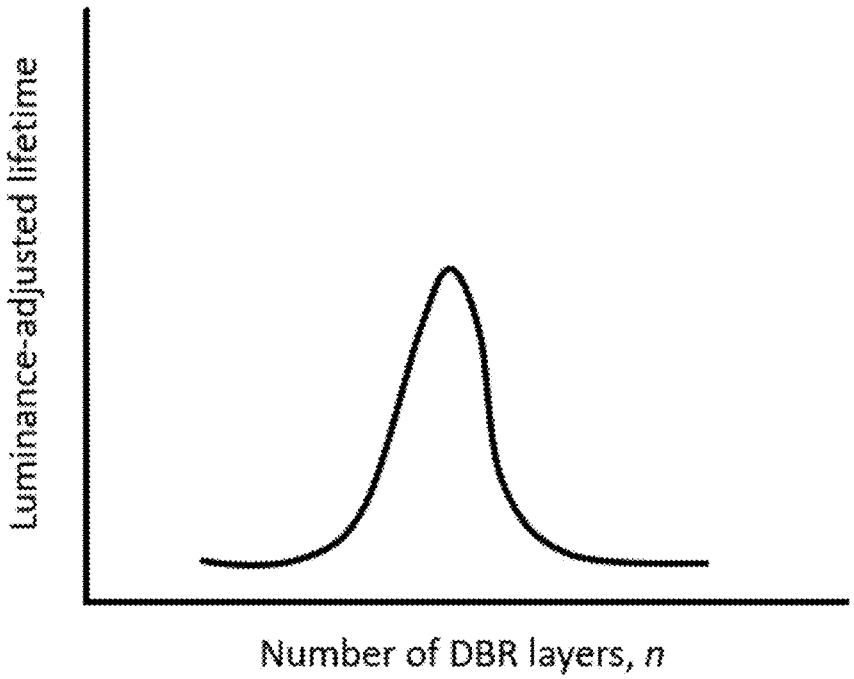
FIG. 5B schematically depicts the an optimal number of DBR layers resulting in a longest luminance-adjusted lifetime for the OLED as a result of the data in FIG. 5A.

While the TPP mode is an emissive state, the EQE of the OLED may still be limited due to a relatively narrow spectral response of the TPP mode. The select wavelengths of light of the TPP mode may not overlap well with a broad spectrum emitter, such as one having a 50-100 nm or more FWHM emission spectrum. For TPP modes, the larger the number of layers in the DBR the less spectral width it has, while the electric field intensity increases. Thus, there may be an optimal number of DBR layers to maximize the luminance-adjusted OLED lifetime, that balances both brightness (i.e., EQE) and stability. For example, it may be desirable for the DBR to have 2-1000 layers. FIG. 5A schematically depicts the expected trend that device stability increases with increasing number of DBR layers while external quantum efficiency decreases. This results in an optimal number of DBR layers providing the longest luminance-adjusted lifetime for the OLED, as shown in FIG. 5B.

Figure 6:
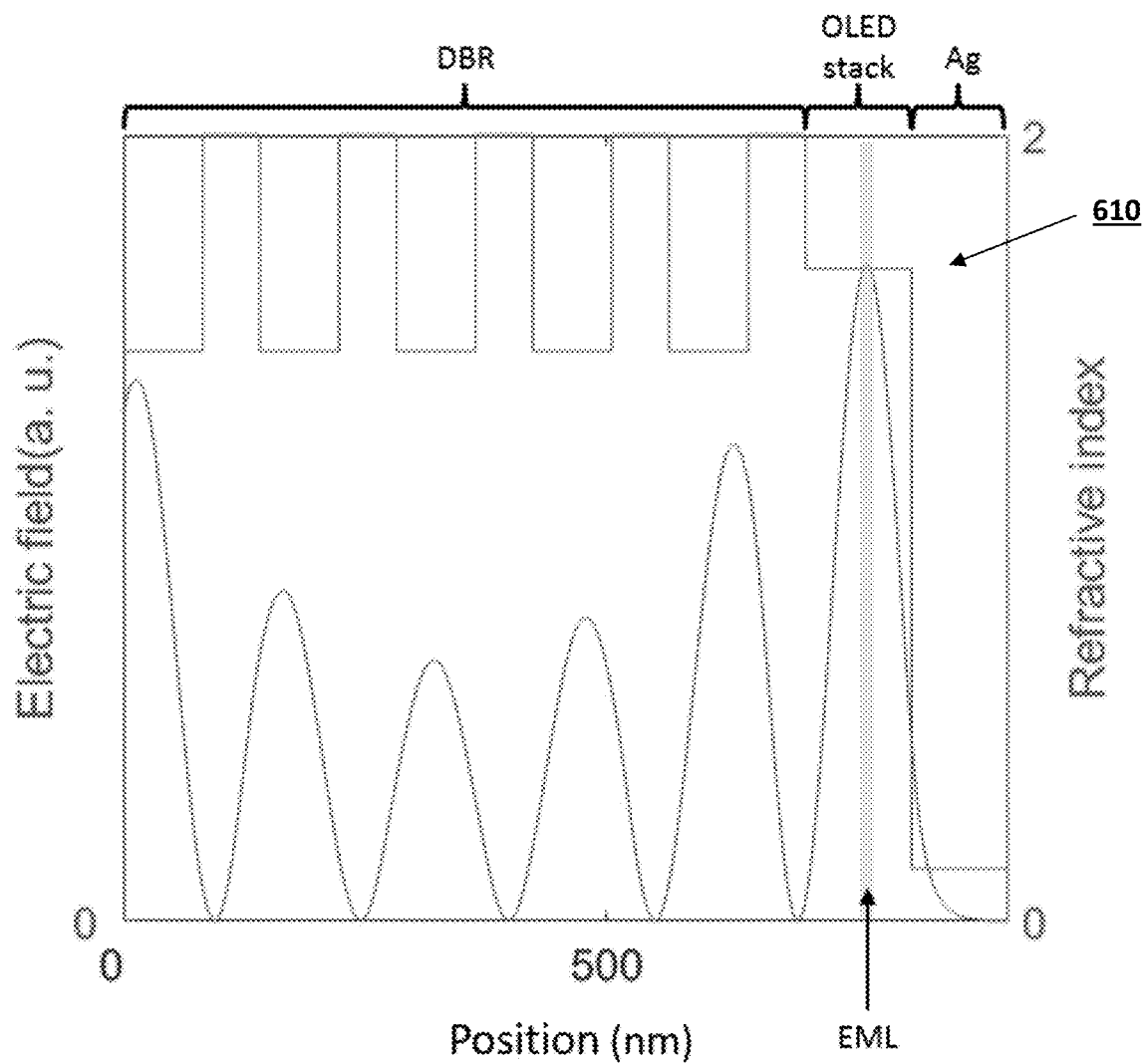
FIG. 6 shows the electric field within an example device such as the device of FIG. 3B, where the OLED is arranged such that the peak in the electric field occurs at the same position as the EML to maximize the Purcell enhancement as disclosed herein.
Figure 7:
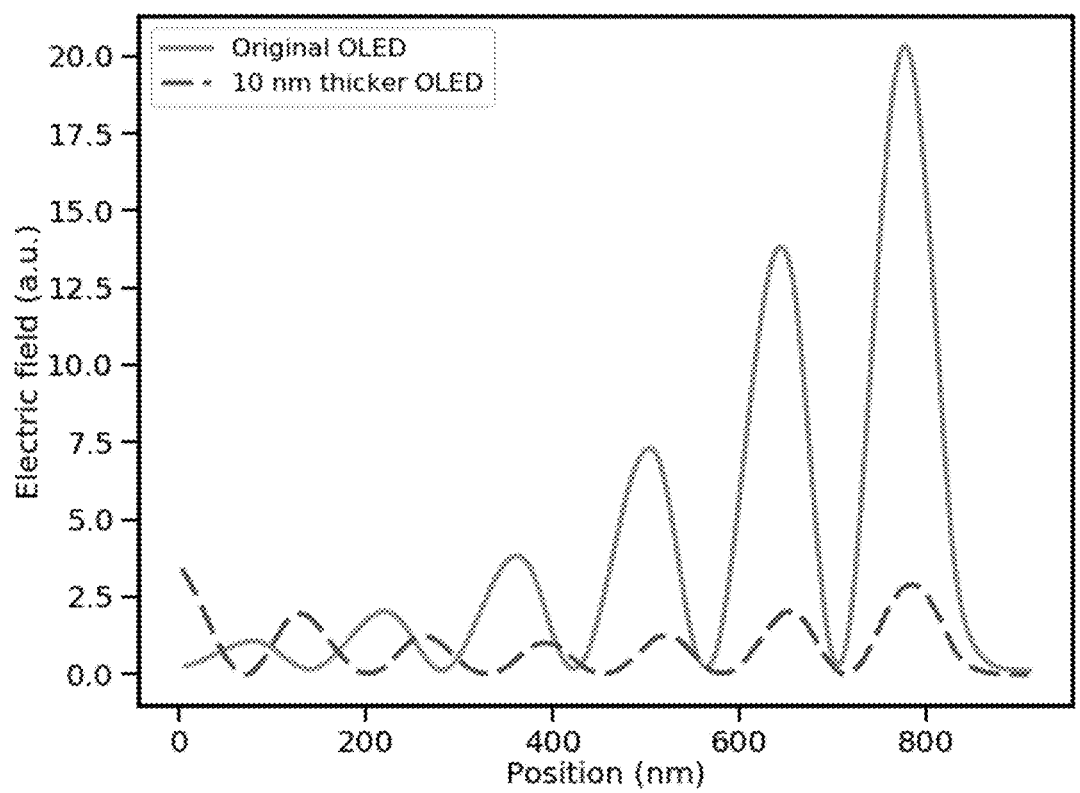
FIG. 7 shows an electric field within two comparative example devices in which the OLED thickness varies by 10 nm, resulting in an altered electric field peak position and intensity as disclosed herein.

It may be desirable to incorporate these phenomena to enhance the OLED emission rate, and hence emitter stability, by arranging the peak of the electric field representing the TPP mode to spatially overlap the emissive layer emissive layer in the OLED stack. FIG. 6 shows the electric field strength and refractive index as functions of position within a stacked device such as shown in FIG. 3B. Notably, the peak in the electric 610 field occurs in the OLED stack at the same position as the emissive layer to maximize the Purcell enhancement. The thickness of the OLED stack also may affect the position of peaks in the electric field, as shown in FIG. 7, which shows that a 10 nm difference in OLED thickness can substantially alter the electric field peak location(s) and intensity. Such structural fine-tuning may be achieved via transfer matrix simulations as well as empirical optimization of the physical device structure.

Figure 8A:
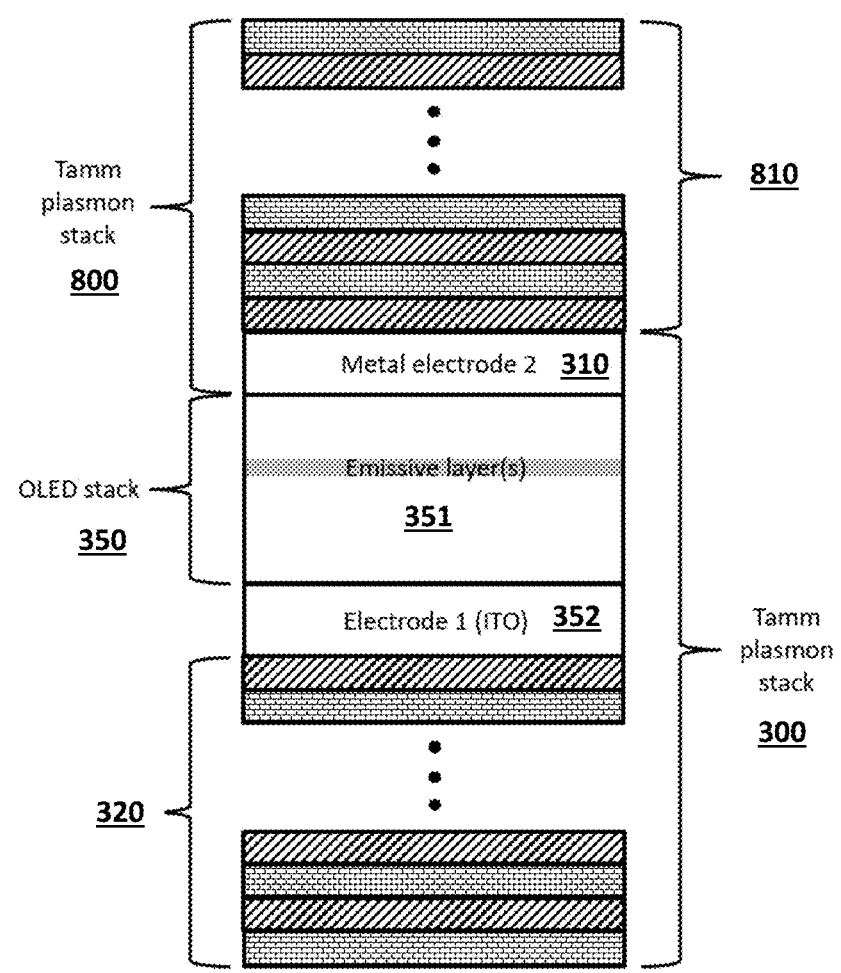
FIGS. 8A and 8B schematically depict device structures similar to those shown in FIGS. 3B and 3C which further incorporate an additional Tamm plasmon stack as disclosed herein.
Figure 8B:
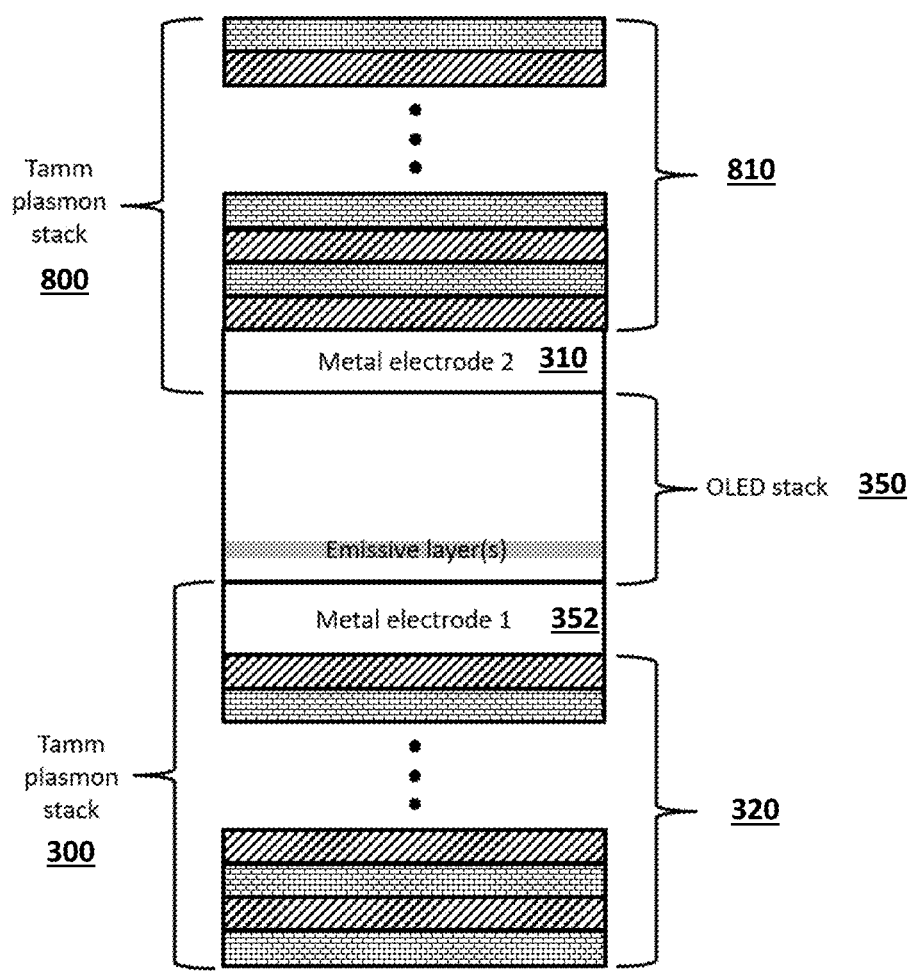

In some cases, it may be desirable to include multiple Tamm plasmon stacks in a single stacked device. FIGS. 8A and 8B show examples of such devices. FIG. 8A shows a device having the same structure as the device in FIG. 3B, with an additional Tamm plasmon stack 800 formed by the upper electrode and an additional reflective layer 810 which may be, for example, a DBR, multi-layer metal thin film, or any other suitable layer as disclosed herein. As previously disclosed, the OLED 350 may be disposed within a Tamm plasmon stack, in this case the stack 300. Alternatively, the OLED may be disposed within the Tamm plasmon stack 800, such as between the reflective layers 810, 310, in which case one or more of the layers may function as an electrode for the OLED stack.

Alternatively, the OLED stack 350 may be disposed outside of and in a stack with the two Tamm plasmon stacks, as shown in FIG. 8B. In this configuration, the layer 310 operates as an electrode for the OLED stack 350 and a reflective layer for the Tamm plasmon stack 800. In other configurations, the reflective layer and electrode may be provided by two separate and distinct, but immediately adjacent, layers. Similarly, the layer 352 operates as an electrode for the OLED stack 350 and a reflective layer for the Tamm plasmon stack 300.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:
1. A device comprising:
a first electrode;
a second electrode;
an organic emissive stack disposed between the first electrode and the second electrode, the organic emissive stack comprising an organic emissive material; and
a first reflective layer disposed in a stack with the organic emissive stack, the first electrode, and the second electrode, and immediately adjacent to the first electrode, the first electrode being disposed between the first reflective layer and the second electrode;
a second reflective layer disposed over the first electrode, the second electrode, the organic emissive stack, and the first reflective layer;
wherein the device includes not more than two reflective layers; and wherein one or more of the first electrode and the second electrode are formed from a metal.

2. The device of claim 1, wherein the first reflective layer is a distributed Bragg reflector (DBR).

3. The device of claim 2, wherein light emitted by the organic emissive stack is within a photonic bandgap of the DBR.

4. The device of claim 1, wherein the first reflective layer comprises a photonic crystal.

5. The device of claim 1, wherein the first reflective layer and the second electrode form a Tamm plasmon stack and the first and second electrodes form an organic light emitting diode (OLED) disposed within the Tamm plasmon stack.

6. The device of claim 5, wherein the first electrode has a maximum thickness not more than 50 nm.

7. The device of claim 5, wherein the first reflective layer comprises a DBR having a number of layers n determined by an external quantum efficiency (EQE) of the OLED or a stability of the OLED.

8. The device of claim 1, wherein the first reflective layer and the first electrode form a Tamm plasmon stack, and the first electrode and the second electrode form an OLED disposed outside the Tamm plasmon stack.

9. The device of claim 8, wherein the first reflective layer comprises a DBR having a number of layers n determined by a luminance-adjusted lifetime of the OLED.

10. The device of claim 8, wherein the first reflective layer comprises a DBR having a number of layers n determined by an external quantum efficiency (EQE) of the OLED or a stability of the OLED.

11. The device of claim 1, wherein the second reflective layer comprises a DBR.

12. The device of claim 1, wherein the second reflective layer and the second electrode form a Tamm plasmon stack.

13. The device of claim 12, wherein the first reflective layer and the second electrode form a Tamm plasmon stack.

14. The device of claim 12, wherein the first electrode and the first reflective layer form a Tamm plasmon stack.

15. The device of claim 14, wherein the second reflective layer and the second electrode form a Tamm plasmon stack.

16. The device of claim 1, wherein the first electrode, the second electrode, the organic emissive stack, and the second reflective layer are disposed over the first reflective layer.

17. The device of claim 1, wherein the device is at least one type selected from the group consisting of: a flat panel display, a computer monitor, a medical monitor, a television, a billboard, a light for interior or exterior illumination and/or signaling, a heads-up display, a fully or partially transparent display, a flexible display, a laser printer, a telephone, a mobile phone, a tablet, a phablet, a personal digital assistant (PDA), a wearable device, a laptop computer, a digital camera, a camcorder, a viewfinder, a micro-display having an active area with a primary diagonal of 2 inches or less, a 3-D display, a virtual reality or augmented reality display, a vehicle, a video wall comprising multiple displays tiled together, a theater or stadium screen, and a sign.

18. The device of claim 1, wherein the first reflective layer and either the first electrode or the second electrode form a Tamm plasmon stack in which surface electromagnetic states of the stack are confined to a region between the two.

19. The device of claim 1, wherein the peak of the electric field that overlaps the organic emissive material has a value not less than an average of all other peaks of the electric field within the device.

20. The device of claim 1, wherein the organic emissive material is disposed at a location within the organic emissive stack that at least partially overlaps a largest peak of an electric field created by the device within the organic emissive stack.

21. The device of claim 1, where both the first electrode and the second electrode are formed from a metal.

* * * * *